United States Patent
Takahashi et al.

(10) Patent No.: US 10,770,259 B2
(45) Date of Patent: Sep. 8, 2020

(54) STAGE DEVICE AND CHARGED PARTICLE BEAM DEVICE

(71) Applicant: Hitachi High-Technologies Corporation, Tokyo (JP)

(72) Inventors: Motohiro Takahashi, Tokyo (JP); Masaki Mizuochi, Tokyo (JP); Shuichi Nakagawa, Tokyo (JP); Hironori Ogawa, Tokyo (JP); Takanori Kato, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/315,700

(22) PCT Filed: Jul. 12, 2017

(86) PCT No.: PCT/JP2017/025365
§ 371 (c)(1),
(2) Date: Jan. 7, 2019

(87) PCT Pub. No.: WO2018/042897
PCT Pub. Date: Mar. 8, 2018

(65) Prior Publication Data
US 2019/0228947 A1    Jul. 25, 2019

(30) Foreign Application Priority Data
Aug. 30, 2016    (JP) .................. 2016-167476

(51) Int. Cl.
*H01J 37/20*    (2006.01)
*F16C 29/00*    (2006.01)
(Continued)

(52) U.S. Cl.
CPC ................ *H01J 37/20* (2013.01); *B23Q 1/72* (2013.01); *F16C 29/001* (2013.01);
(Continued)

(58) Field of Classification Search
CPC .... B23Q 1/72; G12B 5/00; H01J 37/20; H01J 2237/2062; G03F 7/70716; F16C 29/008; F16C 29/002; F16C 29/004; F16C 29/005
See application file for complete search history.

(56) References Cited

U.S. PATENT DOCUMENTS 5,076,714 A * 12/1991 Teramachi .............. F16C 29/12
                                                      384/45
5,158,372 A * 10/1992 Ueki ...................... B23Q 1/017
                                                      384/45
(Continued)

FOREIGN PATENT DOCUMENTS

JP       62-188636 A       8/1987
JP       02-051092 A       2/1990
(Continued)

OTHER PUBLICATIONS

International Search Report of PCT/JP2017/025365 dated Oct. 17, 2017.

Primary Examiner — Wyatt A Stoffa
(74) Attorney, Agent, or Firm — Mattingly & Malur, PC

(57) ABSTRACT

The present invention relates to a charged particle beam device capable of suppressing table deformation caused by movement of a rolling element of a guide with a simple configuration, and a strain isolation guide structure, a stage using the guide structure, and a charged particle beam device using the stage are proposed, the strain isolation guide structure being characterized in that, in a sample stage including a linear guide including a carriage (201), a rolling element, and a guide rail (202), and a table (105), the carriage (201) and the table (105) are connected via an adapter (401) as an elastically deformable member.

9 Claims, 12 Drawing Sheets

(51) Int. Cl.
*B23Q 1/72* (2006.01)
*G12B 5/00* (2006.01)
*F16C 29/06* (2006.01)
*H01L 21/687* (2006.01)

(52) U.S. Cl.
CPC .......... *F16C 29/004* (2013.01); *F16C 29/005* (2013.01); *F16C 29/0673* (2013.01); *G12B 5/00* (2013.01); *H01L 21/68785* (2013.01); *H01J 2237/2062* (2013.01)

(56) References Cited

U.S. PATENT DOCUMENTS

| | | | | |
|---|---|---|---|---|
| 5,249,867 | A * | 10/1993 | Iida | F16C 29/001 384/45 |
| 6,488,411 | B2 * | 12/2002 | Michioka | F16C 19/362 104/119 |
| 7,281,462 | B2 * | 10/2007 | Anderl | B23Q 1/26 83/537 |
| 8,796,906 | B2 * | 8/2014 | Nishimura | H01L 41/0926 310/323.09 |
| 2002/0154838 | A1 * | 10/2002 | Yabe | F16C 29/086 384/15 |
| 2006/0029307 | A1 * | 2/2006 | Fujimura | F16C 29/0657 384/45 |
| 2006/0075868 | A1 * | 4/2006 | Anderl | B30B 15/041 83/523 |
| 2008/0083123 | A1 * | 4/2008 | Hayashi | F16C 29/0671 33/1 M |
| 2013/0082190 | A1 * | 4/2013 | Momoi | G21K 5/08 250/442.11 |
| 2013/0141717 | A1 * | 6/2013 | Nishimura | H01L 41/0913 356/244 |
| 2016/0281777 | A1 * | 9/2016 | Nara | F16C 29/005 |

FOREIGN PATENT DOCUMENTS

| | | |
|---|---|---|
| JP | 02-229914 A | 9/1990 |
| JP | 2000-179548 A | 6/2000 |
| JP | 2004-138193 A | 5/2004 |
| JP | 2004-176825 A | 6/2004 |
| JP | 2006-112458 A | 4/2006 |
| JP | 2008-229811 A | 10/2008 |
| JP | 2008229811 A * | 10/2008 |
| JP | 2011-124404 A | 6/2011 |

* cited by examiner (A1) (A2)

(B1) (B2)

(C1) (C2)

(A)

(B)

(C)

(A)

(B)

(A)

(B)

(A 1)

(A 2)

(B 1)

(B 2)

(C 1)

(C 2)

(D 1)

(D 2)

(A)

(B)

STAGE DEVICE AND CHARGED PARTICLE BEAM DEVICE

TECHNICAL FIELD

The present disclosure relates to a sample stage and a charged particle beam device such as a semiconductor testing device provided with the sample stage, and particularly relates to a sample stage having a structure that suppresses deformation of a table, the deformation causing a visual field position shift, and a charged particle beam device.

BACKGROUND ART

With miniaturization of semiconductor elements in recent years, not only manufacturing devices but also testing devices and measuring devices are required to have high precision corresponding to the respective devices. For example, in a case of measuring pattern dimensions by a semiconductor measuring device and managing exposure conditions and the like of a semiconductor manufacturing line, if a visual field positioning error is large, a pattern at a predetermined position cannot be distinguished from a neighboring pattern, and desired pattern dimensions cannot be measured. In particular, in a case where an interval between patterns is several nanometers and there is no pattern serving as a marker in the vicinity, it is difficult to measure the dimensions of a specific pattern due to deterioration of positioning accuracy due to deformation of a table of a stage caused by a shape error of a guide and variation in rollers of the guide.

In view of the foregoing, a technique for providing a gentle slope called crowning on a bearing surface of a guide to reduce vibration at the time of passage of rolling elements such as rollers is disclosed in PTL 1.

Further, a technique for supporting one of two carriages using a diaphragm-shaped spring to absorb displacement of the carriage due to thermal deformation of a guide, thereby preventing an increase in sliding resistance of the guide is disclosed in PTL 2.

CITATION LIST

Patent Literature

PTL 1: JP 2004-138193 A
PTL 2: JP 2011-124404 A

SUMMARY OF INVENTION

Technical Problem

In a charged particle beam device including a stage for conveying a wafer, change in sliding resistance caused by vibration and thermal deformation of a table due to going in and out of rollers can be reduced by using a guide structure as described above. However, in the case of providing the crowning on the bearing surface of the carriage of the guide as disclosed in PTL 1, a large bearing surface is required in order to realize the same guide rigidity, and the dimensions of the carriage increase. Further, force applied to the carriage at the time of going in and out of the rollers does not decrease, and thus deformation of the carriage occurs and the deformation is transmitted to the table, causing position shift of a sample. Further, in the case of supporting one of the carriages by the spring as disclosed in PTL 2, strain is transmitted from the other of the carriages to the table, and thus there is a problem that the effect of suppressing the deformation of the table is insufficient. Further, the rigidity of the guide on the side to which the spring is applied significantly decreases, and vibration characteristics may be deteriorated in some cases.

Hereinafter, a strain isolation guide structure for the purpose of suppressing deformation of a table due to movement of a rolling element of a guide and improving visual field positioning accuracy in a case of a charged particle beam device, for example, will be described.

Solution to Problem

As an aspect for achieving the above object, proposed is a sample stage including a table that supports a sample, a guide rail that guides the table in a specific direction, and a carriage that supports the table and moves along the guide rail together with the table by movement accompanying rotation of a rolling element included inside the carriage, the sample stage including an adapter connecting the table and the carriage and having a first protruding portion protruding toward at least one of the table and the carriage, in which the protruding portion is connected to the table or the carriage, and is formed such that a length in at least one of a first moving direction and a direction orthogonal to the first moving direction of the table is longer than a length in another of the first moving direction and the direction orthogonal to the first moving direction or such that a plurality of projections is arrayed in the first moving direction or the direction orthogonal to the first moving direction.

As another aspect for achieving the above object, proposed is a sample stage including a table that supports a sample, a guide rail that guides the table in a specific direction, and a carriage that supports the table and moves along the guide rail together with the table by movement accompanying rotation of a rolling element included inside the carriage, in which a contact portion being in contact with the table and a connection portion connecting the contact portion and another portion of the carriage are formed in the carriage, and the connection portion is formed such that a length in at least one of a first moving direction and a direction orthogonal to the first moving direction of the table is longer than a length in another of the first moving direction and the direction orthogonal to the first moving direction or such that a plurality of projections is arrayed in the first moving direction or the direction orthogonal to the first moving direction.

Advantageous Effects of Invention

According to the above configuration, deformation of a table due to movement of a rolling element of a guide can be suppressed.

BRIEF DESCRIPTION OF DRAWINGS

FIG. 11 is an external view of the carriage in which the strain isolation guide structure is built in.

DESCRIPTION OF EMBODIMENTS

Figure 1:
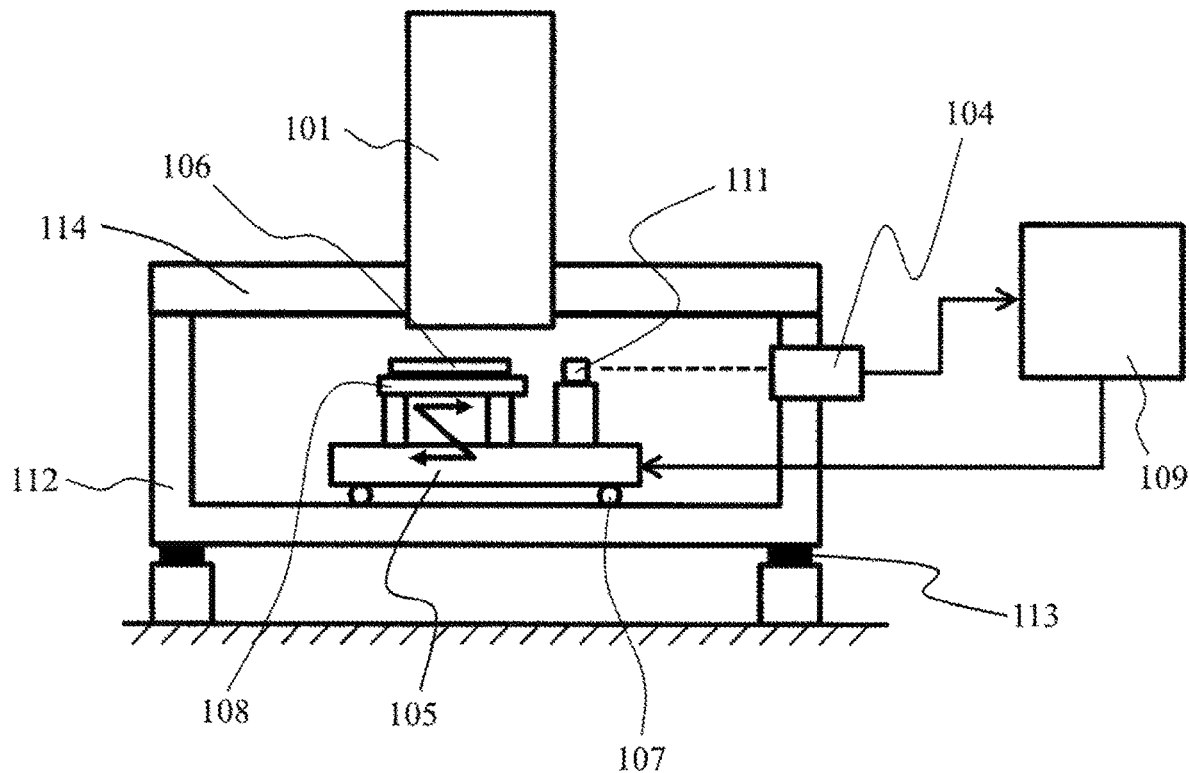
FIG. 1 is a diagram illustrating a configuration of a charged particle beam device.

In embodiments to be described below, a strain isolation guide structure, a stage using the guide structure, and a charged particle beam device using the stage will be mainly described, the strain isolation guide structure being characterized in that, in a sample stage including a guide rail, a carriage, and a table, the carriage and the table are connected via an adapter as an elastically deformable member, a connection portion between the adapter and the carriage is a range having a longitudinal direction in a driving direction of the carriage, and the connection portion between the adapter and the carriage and a connection portion between the adapter and the table are alternated.

According to the above configuration, in a stage device including a rolling guide, deformation of the table due to rolling element movement can be suppressed and a visual field positioning error can be suppressed.

First Embodiment

An embodiment described below relates to a structure of a stage guide carriage including a rolling guide, and relate to a strain isolation guide structure provided with a member that absorbs a strain in a connection portion between a carriage and a table.

The strain isolation guide structure is configured by an elastically deformable adapter, a carriage, and a table, and a connection portion between the adapter and the carriage and a connection portion between the adapter and the table are alternated in a longitudinal direction.

According to the above configuration, in the stage device including the rolling guide, the strain isolation guide structure capable of suppressing deformation of the table due to rolling element movement and improving visual field positioning accuracy is provided.

An example of a charged particle beam device will be described with reference to FIG. 1. Here, as an example of the charged particle beam device, an example of a semiconductor measurement device (hereinafter referred to as a critical dimension SEM) will be described. In the critical dimension SEM, an electronic optical system barrel 101 is mounted on a sample chamber 112, and the sample chamber 112 is supported by a vibration removal mount 113. An electron beam is radiated onto a wafer 106 from the electronic optical system barrel 101, a pattern on the wafer 106 is imaged, and a line width of the pattern is measured and shape accuracy is evaluated. In the sample chamber 112, a stage having a table 105 as a movable portion is mounted, and a chuck 108 for mounting the wafer 106 as an object to be observed is fixed to the table 105. Further, the table 105 is supported by a guide 107, the position of a mirror 111 is measured by a laser interferometer 104 and stage coordinates are obtained, and the positioning control is performed by a controller 109.

When the table 105 is deformed, a relative distance between the chuck 108 and the mirror 111 varies, and image shift occurs in a case where a position of an observation point on the wafer is managed with a laser measurement value. However, in a case where there is reproducibility in the laser measurement value and the image shift including the deformation of the table, a correction map can be created by recording an image shift amount on coordinates. By subtracting the image shift amount on the correction map from a target position coordinate or a beam shift amount of the stage, an influence on the image shift can be caused to be a value close to zero for the reproducible table deformation. However, in a case where there is no reproducibility in the table deformation or a non-reproducible component is mixed, the influence on the position shift cannot be caused to be zero even using the correction map. This uncorrectable image shift is referred to as a visual field positioning error. In particular, to measure a device with a pattern interval of several nm, the visual field positioning error needs to be reduced to the utmost limit.

Patterns of deformation of a carriage due to going in and out of the rolling element will be described with reference to FIG. 2. In a linear guide, a guide rail 202 is fixed and a carriage 201 is set to a movable side, and a cylindrical or spherical rolling element 203 is arranged in a bearing clearance, thereby to cause a relationship between the guide rail 202 and the carriage 201 to be in a state where only rolling friction with small resistance occurs, not sliding friction with large resistance, to enable sliding in a specific direction. That is, the carriage 201 moves along the guide rail 202 with rotation of the rolling element 203. Furthermore, to reduce rattling caused by a dimensional difference between the bearing clearance and the rolling element 203, pressurization is applied to the carriage to press the rolling element against the guide rail. As a result, the cross section of the rolling element 203 is deformed from a perfect circle to an elliptical shape by receiving the pressurization.

Figure 2:
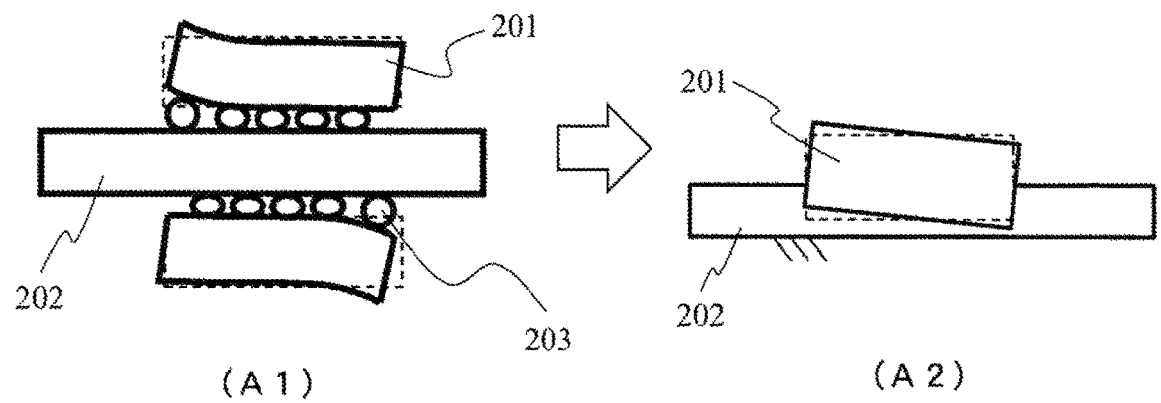
FIG. 2 is views illustrating deformation of a carriage at the time of rolling element movement.
Figure 2:
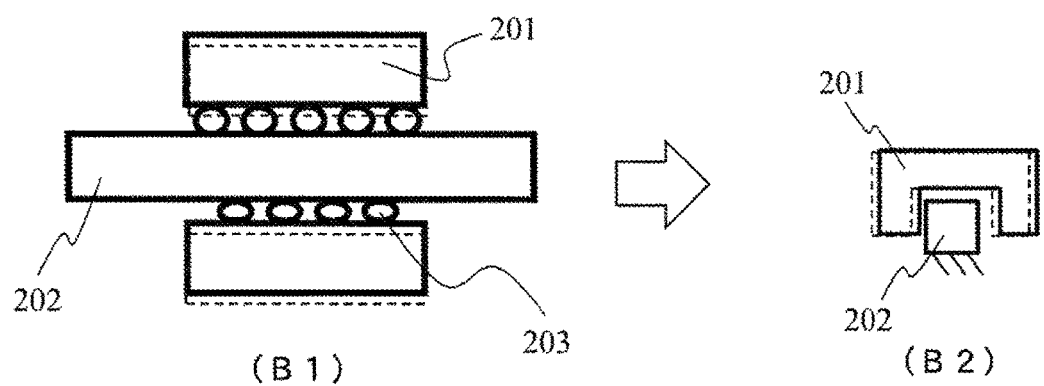
Figure 2:
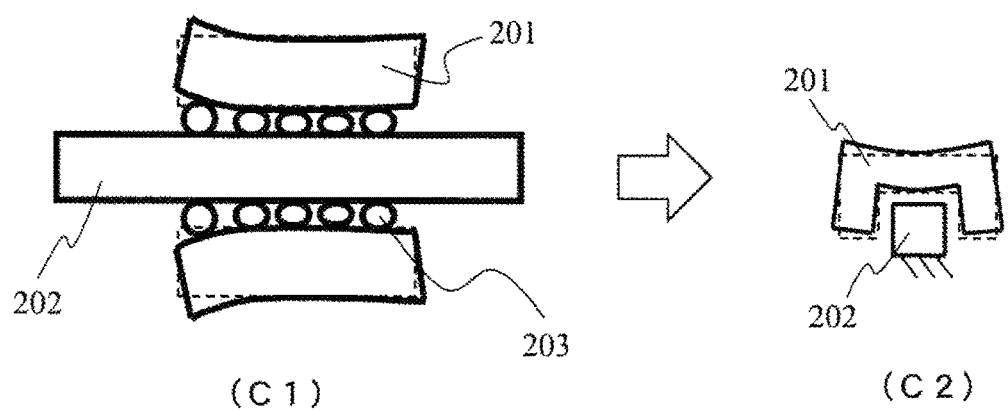

FIG. 2(A1) is an example of a case where phases of going in and out of the rolling elements 203 across the guide rail 202 to the clearance between the carriage 201 and the guide rail 202 are shifted. At the point of time when the rolling element 203 begins to enter the bearing clearance in an instant before entering the bearing clearance, the rolling element 203 is not crushed as compared with other rolling elements because bearing pressurization is not applied. The same applies to the rolling element when going out of the bearing clearance. In this case, the carriage is deformed as illustrated in FIG. 2(A1), and posture change that the carriage is inclined with respect to the guide rail occurs, as illustrated in FIG. 2(A2), accordingly.

FIG. 2(B1) is an example of a case where the numbers of the rolling elements 203 across the guide rail 202 are different. A collapse amount of the rolling element 203 is proportional to a value obtained by dividing the bearing pressurization by the number of the rolling elements 203 in the bearing clearance. That is, in a case where the number of rolling elements 203 on the upper side is larger than the number of the rolling elements 203 on the lower side as illustrated in FIG. 2(B1), the collapse amount of the rolling elements 203 on the upper side becomes smaller than the collapse amount of the rolling elements 203 on the lower side, and the carriage 201 translates upward. As a result, the translation motion of the carriage occurs with respect to the guide rail, as illustrated in FIG. 2(B2). Since the direction of the translation motion depends on which bearing clearance the relationship occurs, the translation motion may occur in any of upward, downward, rightward, leftward, and oblique directions with respect to the guide rail.

FIG. 2(C1) is an example of case where phases of going in and out of the rolling elements 203 across the guide rail 202 to the bearing clearance are aligned. Although the carriage 201 is deformed in a similar manner to in FIG. 2(A1), the upper and lower carriages are deformed in a target shape across the guide rail. Therefore, bending deformation occurs in the carriages, as illustrated in FIG. 2(C2). Further, the direction of the bending deformation may occur in both of a sliding direction of the guide and a direction perpendicular to the sliding direction of the guide.

Figure 3:
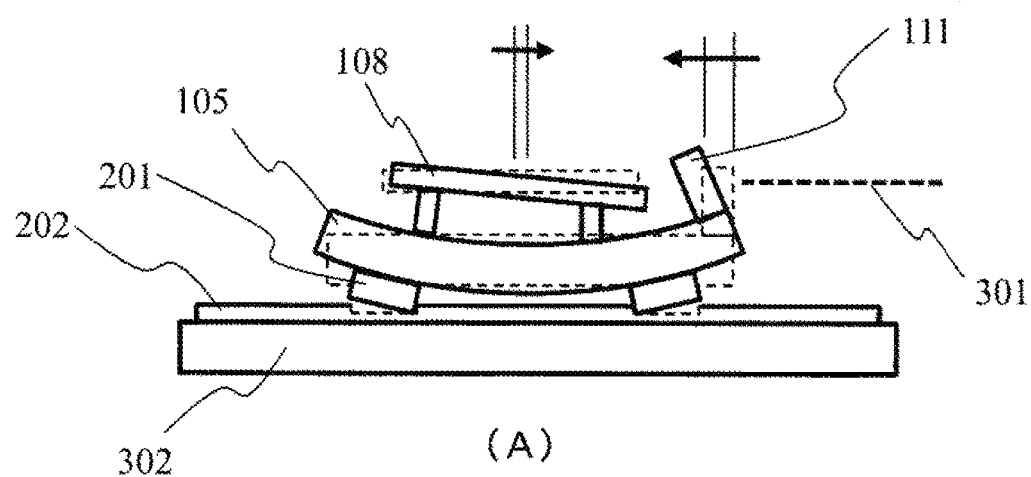
FIG. 3 is views illustrating table deformation at the time of carriage deformation.
Figure 3:
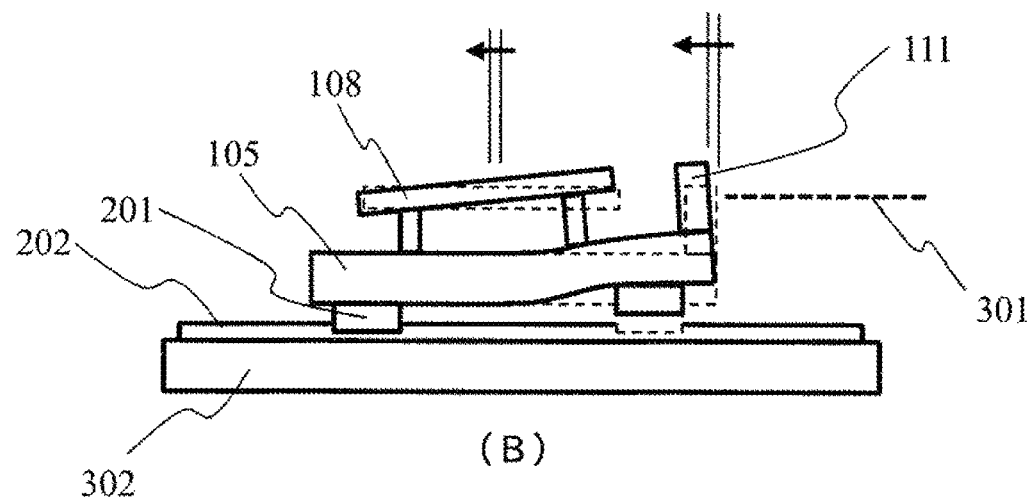
Figure 3:
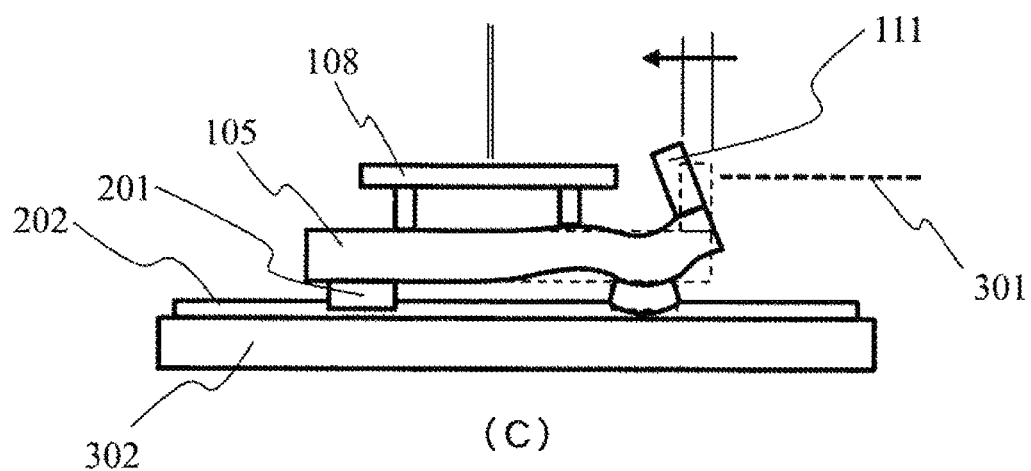

Deformation of the table caused by inclination, translation, and deformation of the carriage, and change in a relative distance between the chuck and the mirror accompanying the deformation of the table will be described with reference to FIG. 3.

As a configuration of the stage, the configuration described in FIG. 1 is illustrated in more detail, and the chuck and the mirror are mounted on the table. A base 302 is fixed in a uniaxial stage in which a movable direction is one direction, and corresponds to a lower table in an XY stage in which the movable directions are two directions. The guide rail is fixed to an upper surface of the base 302, and the carriage is movable relative to the guide rail, and the table is mounted on the carriage. To measure the position of the mirror by the laser interferometer as the position of the table, the mirror 111 is irradiated with laser light 301.

In a case where the carriage 201 is inclined with respect to the guide rail, as illustrated in FIG. 3(A), bending deformation is caused in the table 105, and the relative distance between the mirror 111 and the chuck 108 changes. Further, even in a case where a translation motion is caused in the carriage, as illustrated in FIG. 3(B), the bending deformation is caused in the table 105, and the relative distance between the mirror 111 and the chuck 108 changes. Further, even in a case where the bending deformation is caused in the carriage, as illustrated in FIG. 3(C), local bending deformation is caused in the table 105, and the relative distance between the mirror 111 and the chuck 108 changes due to collapse of the mirror.

In particular, in the case where the carriage is inclined as illustrated in FIG. 3(A), the positions of the mirror and the chuck are shifted in opposite directions, and thus the change in the relative distance is large. In the critical dimension SEM, the positioning of the wafer and determination of a beam deflection amount of the image shift are performed from the position of the mirror. Therefore, the change in the relative distance between the mirror and the chuck becomes the image shift.

Figure 4:
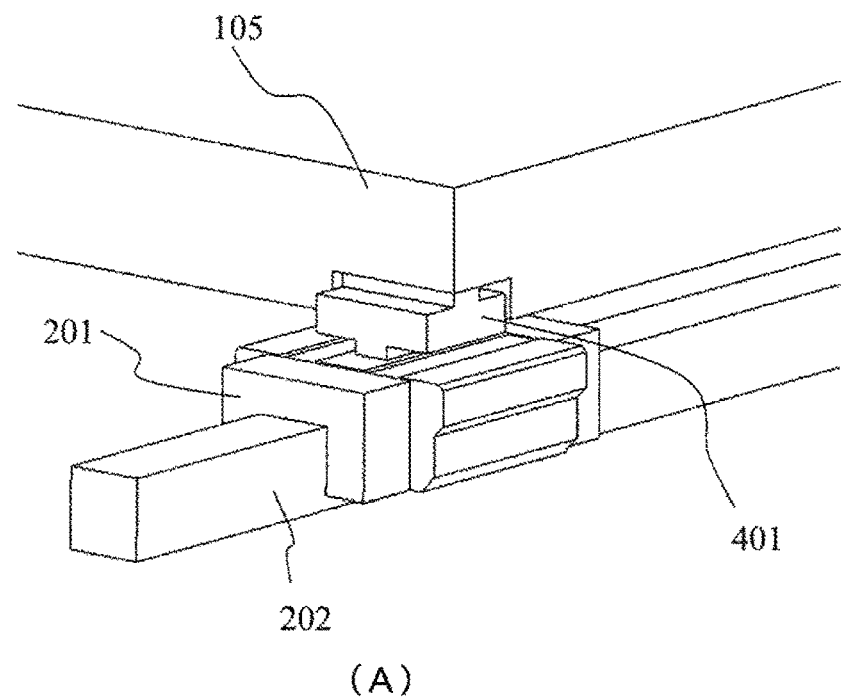
FIG. 4 is views illustrating a configuration of a strain isolation guide structure.
Figure 4:
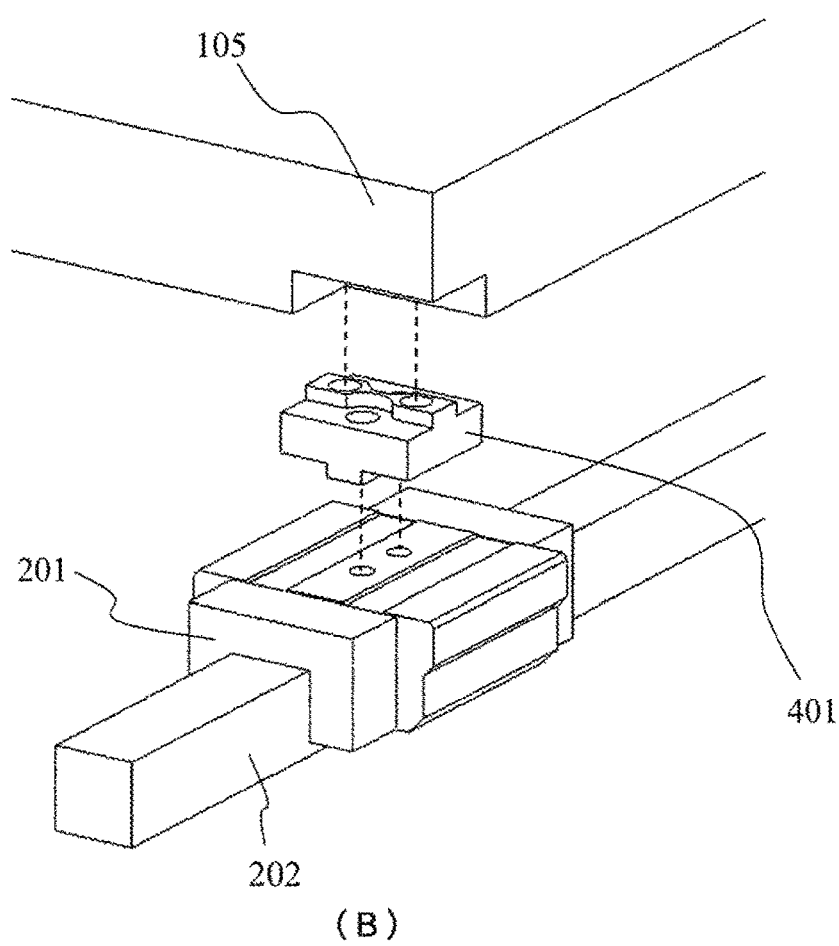

A stage in which an adapter as an elastic member for realizing a strain reduction structure is mounted will be described with reference to FIG. 4.

As illustrated in FIG. 4(A), the stage is configured to sandwich an adapter 401 between the table 105 and the carriage 201, and the carriage 201 is connected to the table 105 via the adapter. Further, FIG. 4(B) illustrates an exploded view of the stage. The carriage 201 and the adapter 401 are fastened through bolt holes aligned in a longitudinal direction of the guide rail 202, that is, in a driving direction of the carriage (first moving direction). Further, the table 105 and the adapter 401 are fastened through bolt holes aligned in a direction perpendicular to the longitudinal direction of the guide rail 202.

Figure 5:
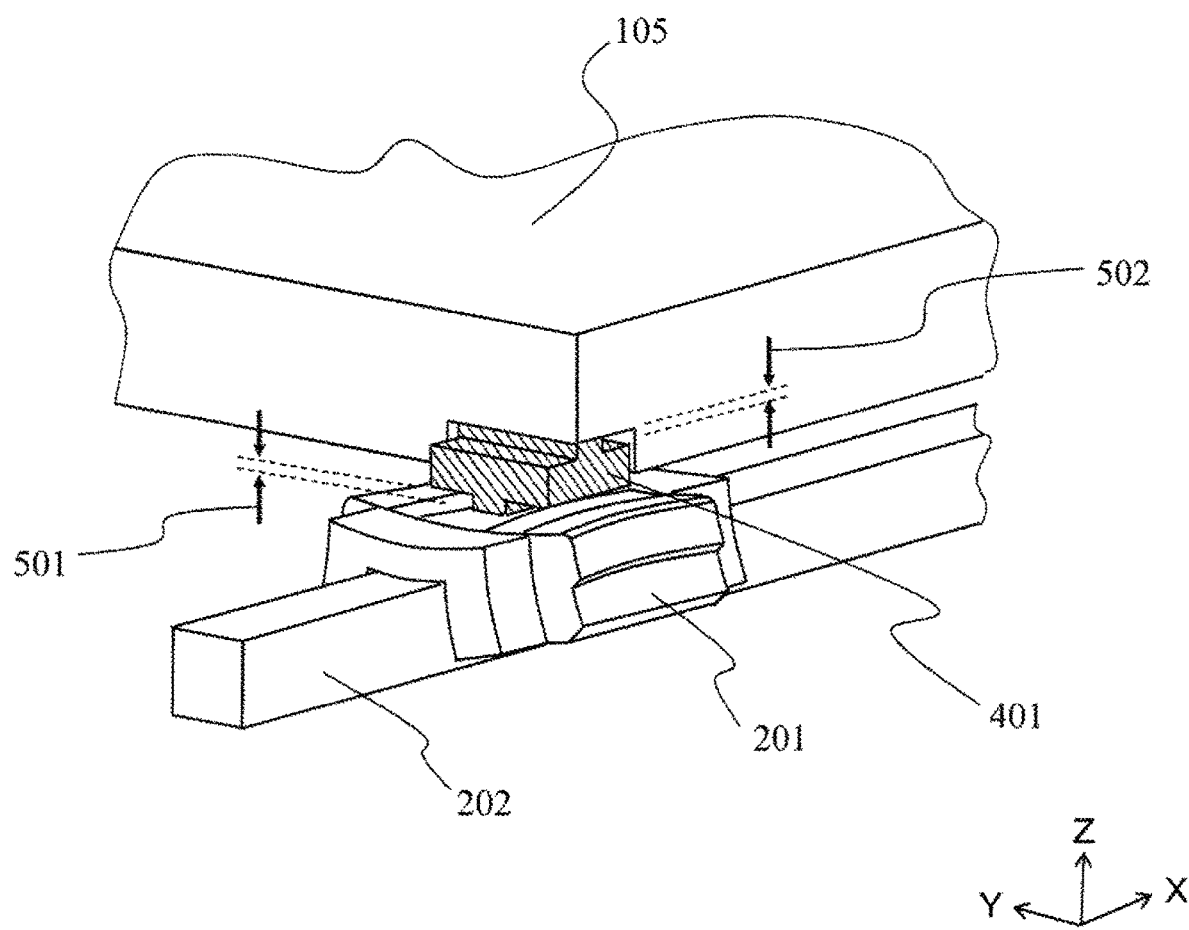
FIG. 5 is a view illustrating a configuration and deformation of the strain isolation guide structure.

FIG. 5 illustrates a basic configuration of the stage including the table 105, the guide rail 202, the carriage 201, and the adapter 401. As illustrated in FIG. 5, a protruding portion (lower protruding portion) having a longer length in a moving direction of the carriage 201 than a length in a direction perpendicular to the moving direction of the carriage 201 is provided, whereby a clearance gap 501 is formed between the adapter and the carriage 201. Meanwhile, a protruding portion (upper protruding portion) having a longer length in the direction perpendicular to the moving direction of the carriage 201 than a length in the moving direction of the carriage 201 is provided, whereby a clearance gap 502 is formed between the table 105 and the adapter. Note that, in a case of an X-Y stage, the direction perpendicular to the moving direction of the carriage 201 is another moving direction (second moving direction) of the table.

With the configuration, even in a case where the carriage 201 is deformed, the deformation is not transmitted to the table 105. Further, the table 105 is provided with a dug portion for housing the adapter, whereby the overall height of the stage can be suppressed to be low and pitching vibration due to a low center of gravity can be suppressed. Note that, FIG. 5 illustrates the example of providing the protruding portion long in a specific direction (the moving direction of the carriage, for example). However, the clearance gap may be formed while securing the rigidity in the specific direction by arraying a plurality of projections in the specific direction.

Figure 6:
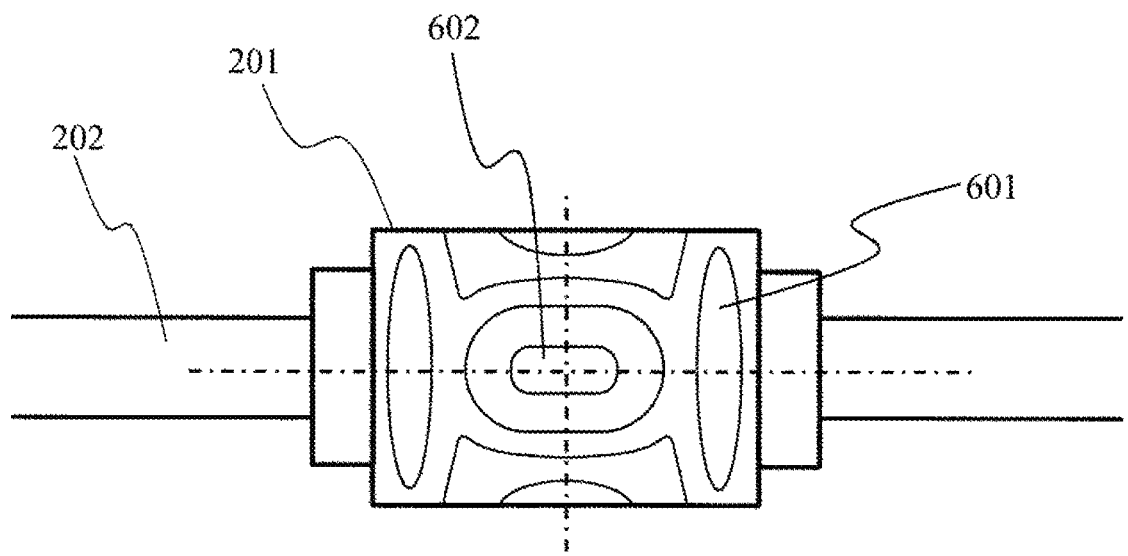
FIG. 6 is views illustrating strain distribution and a deformation shape of the carriage.
Figure 6:
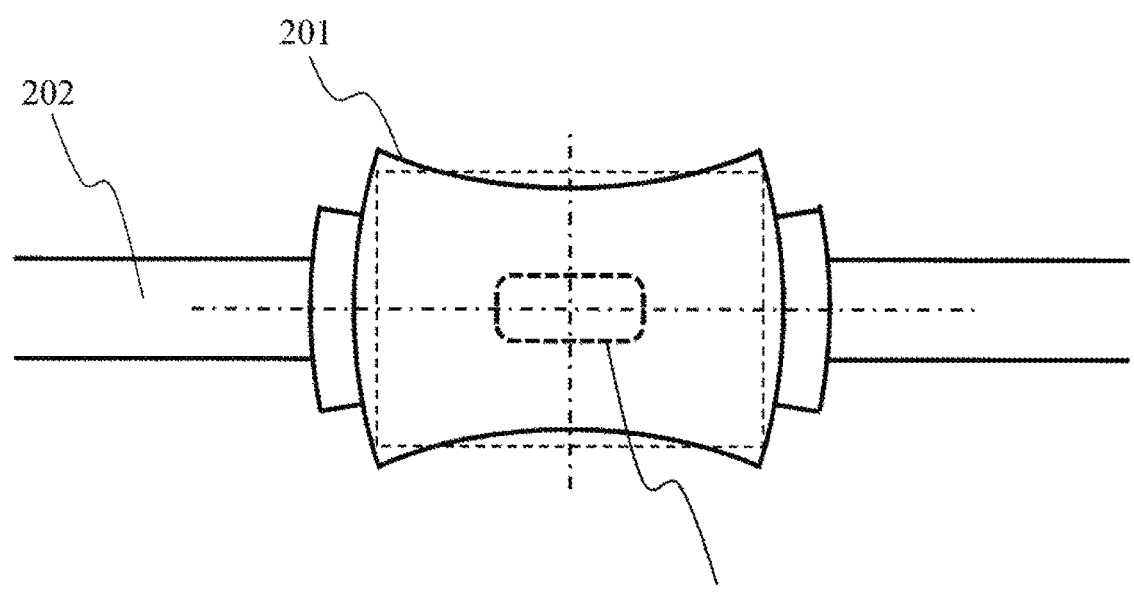

Examples of a distribution shape of a strain caused in the carriage and a deformation shape of the carriage will be described with reference to FIG. 6. A strain caused on an upper surface of the carriage in a case where the rolling element goes in and out was measured using a strain sensor. FIG. 6(A) illustrates schematic distribution of the magnitude of strain change on the basis of a result of the measurement. The strain change is large in a portion corresponding to a periphery on the upper surface of the carriage in a range 601, and the strain change is minimum in a portion corresponding to the center of the carriage in a range 602.

FIG. 6(B) illustrates the deformation shape of the carriage in the case where the rolling element goes in and out. The shape is estimated from the measurement result of the strain. Since a portion corresponding to the center of the carriage in a range 603 is hardly deformed, it is desirable to fix the adapter using this range in a case of connecting the adapter. Note that a longitudinal direction of the range 603 is parallel to the longitudinal direction of the guide rail.

A mechanism in which propagation of the inclination, translation, and deformation of the carriage, which are caused when the rolling element goes in and out, to the table is isolated by the adapter will be described with reference to FIG. 7.

Figure 7:
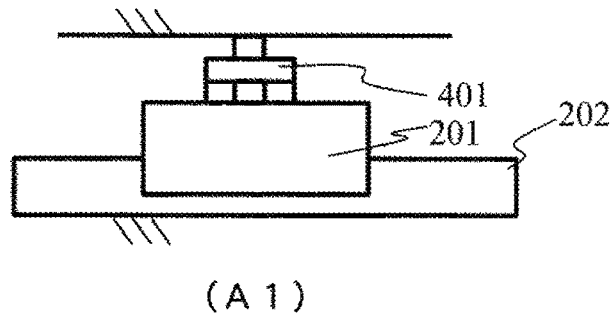
FIG. 7 is views illustrating deformation of an adapter at the time of inclination, translation, and deformation of the carriage.
Figure 7:
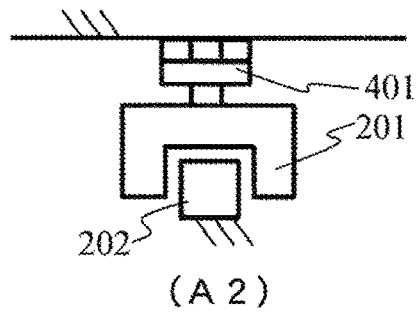
Figure 7:
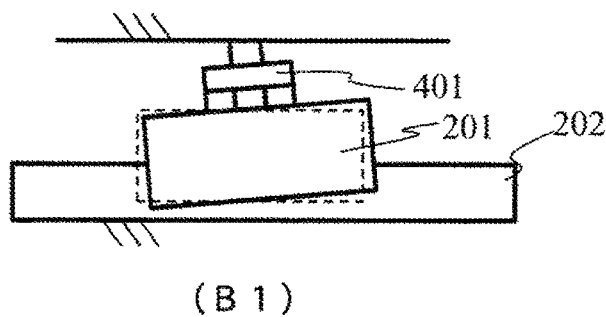
Figure 7:
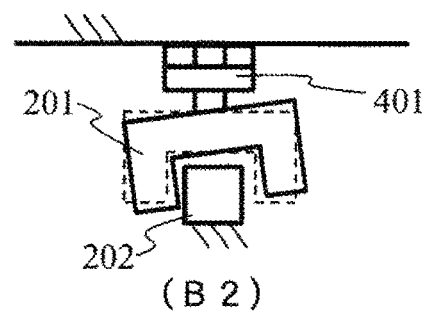
Figure 7:
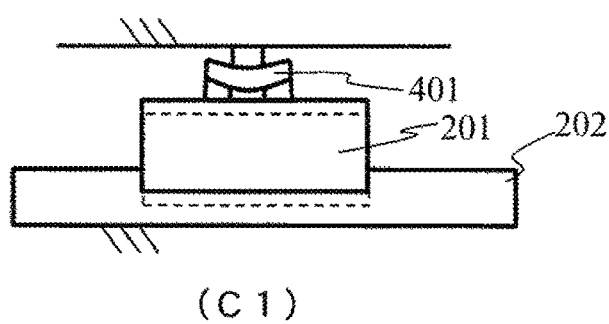
Figure 7:
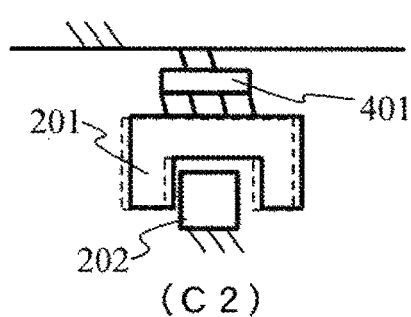
Figure 7:
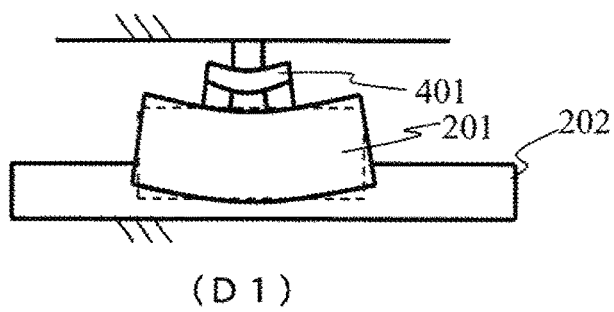
Figure 7:
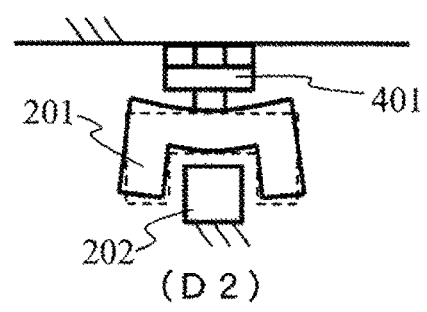

FIG. 7(A1) illustrates a side view of the guide rail as viewed from a direction perpendicular to a movable direction in a case where the adapter is installed between the carriage and the table. Further, FIG. 7(A2) illustrates a view of the guide rail as viewed from the movable direction of the guide rail.

FIGS. 7(B1) and 7(B2) are views of deformation of the adapter in a case where the carriage is inclined with respect to the guide rail. In particular, FIG. 7(B1) is a view of a case where pitching occurs in the carriage, and displacement due to the inclination of the carriage is absorbed without being transmitted to the table by the effect of the clearance gap 502 illustrated in FIG. 5. Similarly, FIG. 7(B2) illustrates a view of a case where rolling occurs in the carriage, and the inclination of the carriage is absorbed by the effect of the clearance gap 501 illustrated in FIG. 5. With the configuration, propagation of the inclination of the carriage to the table can be prevented even if the carriage is inclined in which direction.

FIGS. 7(C1) and 7(C2) are views of a case where the carriage is translated in parallel with respect to the guide rail without being inclined. In particular, FIG. 7(C1) illustrates a case where the carriage is translated in an up-down direction, and the deformation of the table is suppressed by elastic deformation of the adapter such that the adapter is bent. Further, FIG. 7(C2) illustrates a case where the carriage is translated in a horizontally lateral direction, and the deformation of the table is suppressed by shearing deformation of the adapter.

FIGS. 7(D1) and 7(D2) illustrate deformation views of the adapter in a case where the carriage is bent and deformed. In particular, FIG. 7(D1) illustrates a case where the carriage is deformed to open in the movable direction of the guide rail, and propagation of the deformation of the carriage to the table can be prevented by the effect of the clearance gap 502 in FIG. 5. Further, FIG. 7(D2) illustrates a case where the carriage is deformed to open in the direction perpendicular to the movable direction of the guide rail, and the deformation of the carriage is absorbed by the effect of the clearance gap 501 in FIG. 5.

Figure 8:
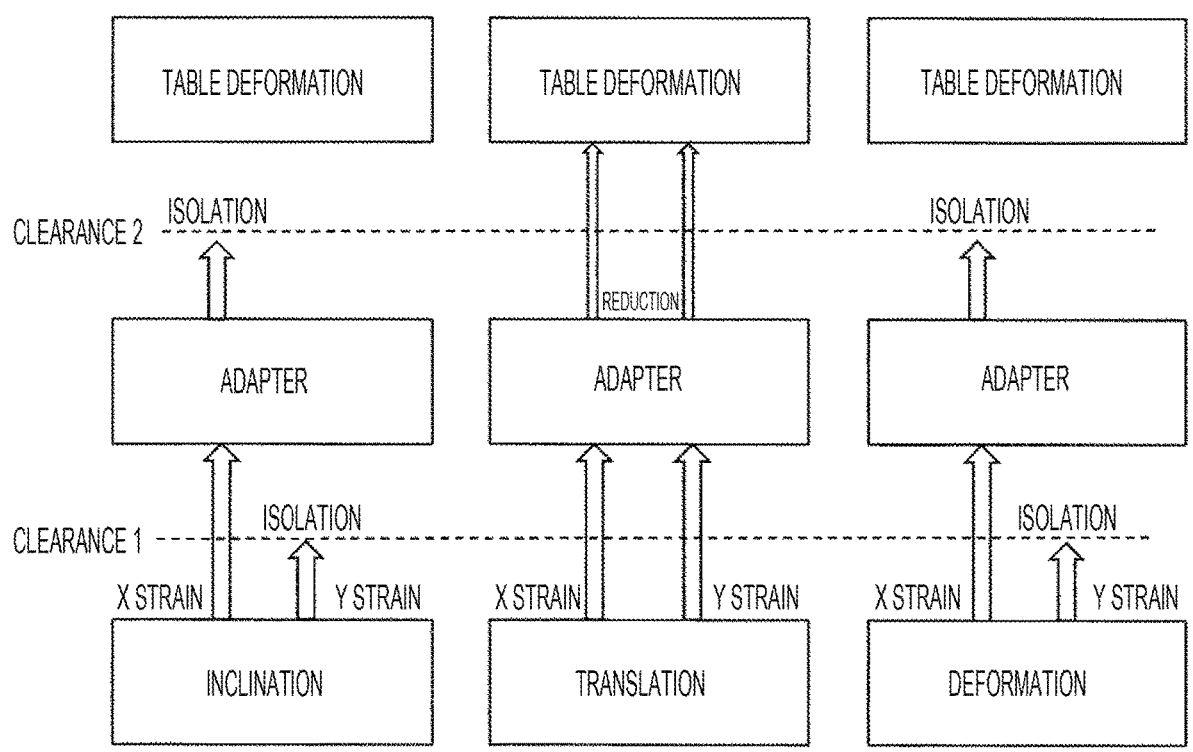
FIG. 8 is a diagram illustrating a transmission path of a strain.

A transmission path of the strain in a case where the adapter lies in transmission of the strain of the carriage due to the inclination, translation, and deformation to the table will be described with reference to FIG. 8. A clearance 1 in FIG. 8 corresponds to the clearance gap 501 in FIG. 5, and a clearance 2 corresponds to the clearance gap 502 in FIG. 5. Further, the strain of the guide in the movable direction is expressed as an X strain, and the strain in the direction perpendicular to the movable direction is expressed as a Y strain. The X strain due to the inclination and deformation is isolated by the clearance 2, and the Y strain due to the inclination and deformation is isolated by the clearance 1. Further, the X and Y strains due to the translation are reduced by elastic deformation of the adapter. As described above, any strain caused in the carriage can be reduced by the adapter.

Figure 9:
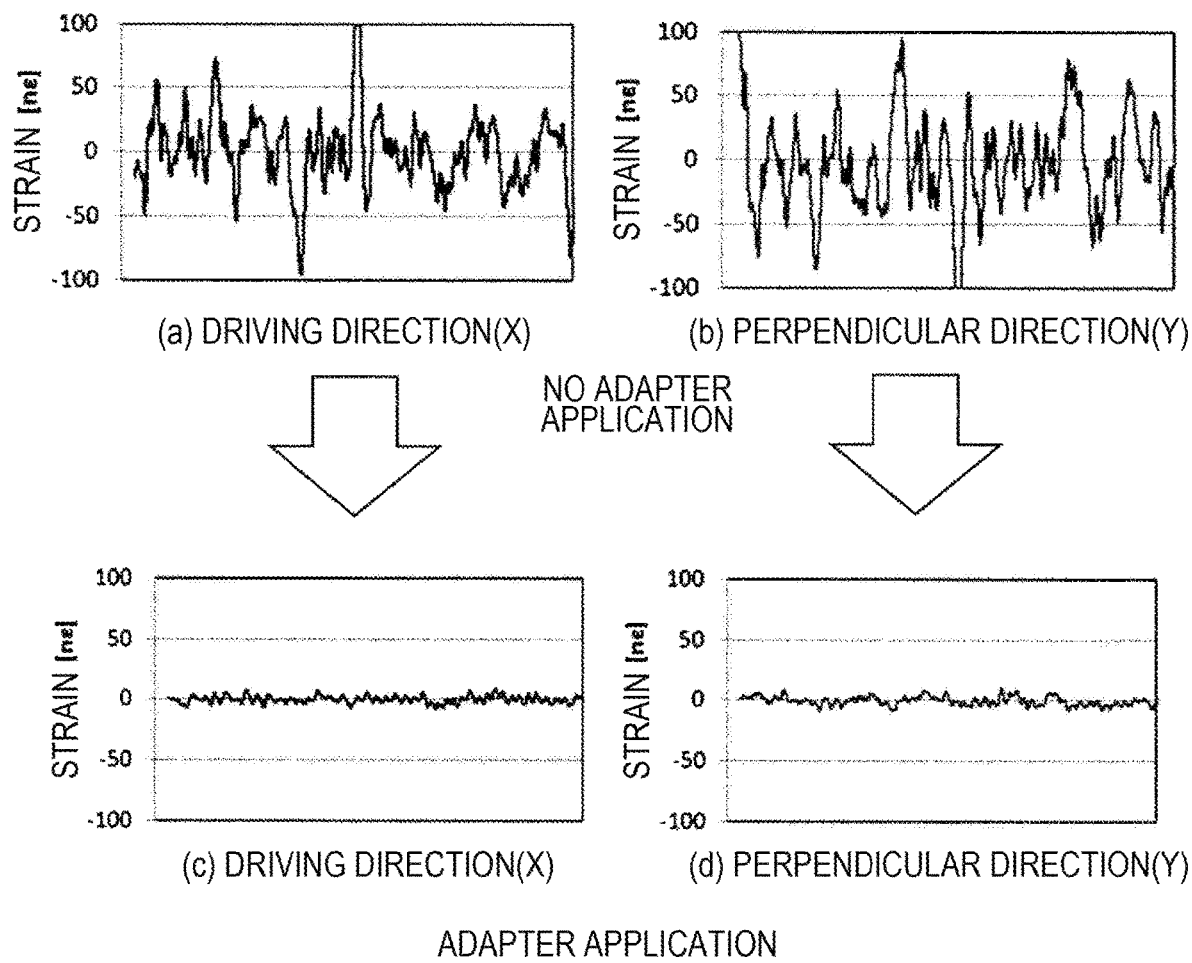
FIG. 9 illustrates measurement results of strain reduction effect by the adapter.

An example of measurement results of a strain of the table caused by the propagation of the stain of the carriage to the table, the strain being caused by going in and out of the rolling element, will be described with reference to FIG. 9. The horizontal axis represents a moving amount of the table, and the vertical axis represents the strain of the table. Comparison is made between cases (a) and (b) in which no adapter is applied to the stage, and cases (c) and (d) in which the adapter is applied to the stage. In the case where the adapter is applied, the strain is significantly reduced both in the movable direction of the guide and in the direction perpendicular to the movable direction of the guide, and the propagation of the strain to the table is suppressed, as compared with the case where the adapter is not applied.

Second Embodiment

Figure 10:
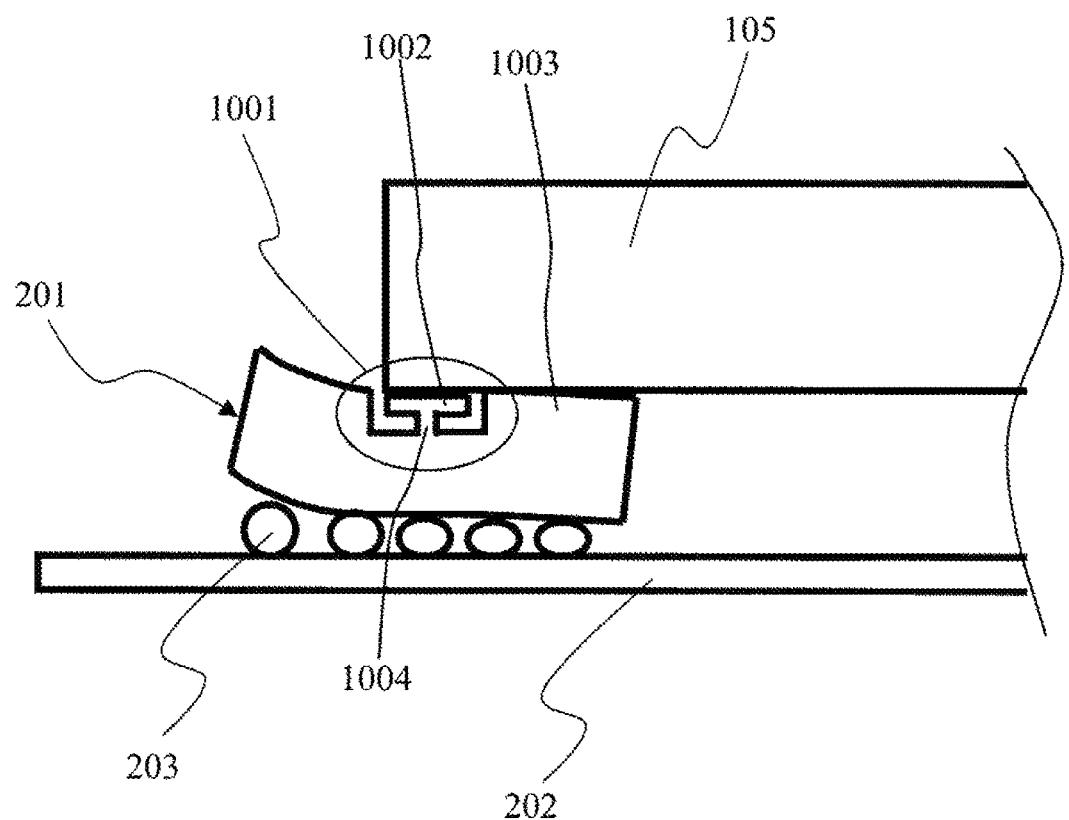
FIG. 10 is a view illustrating an example in which the strain isolation guide structure is built in the carriage.
Figure 11:
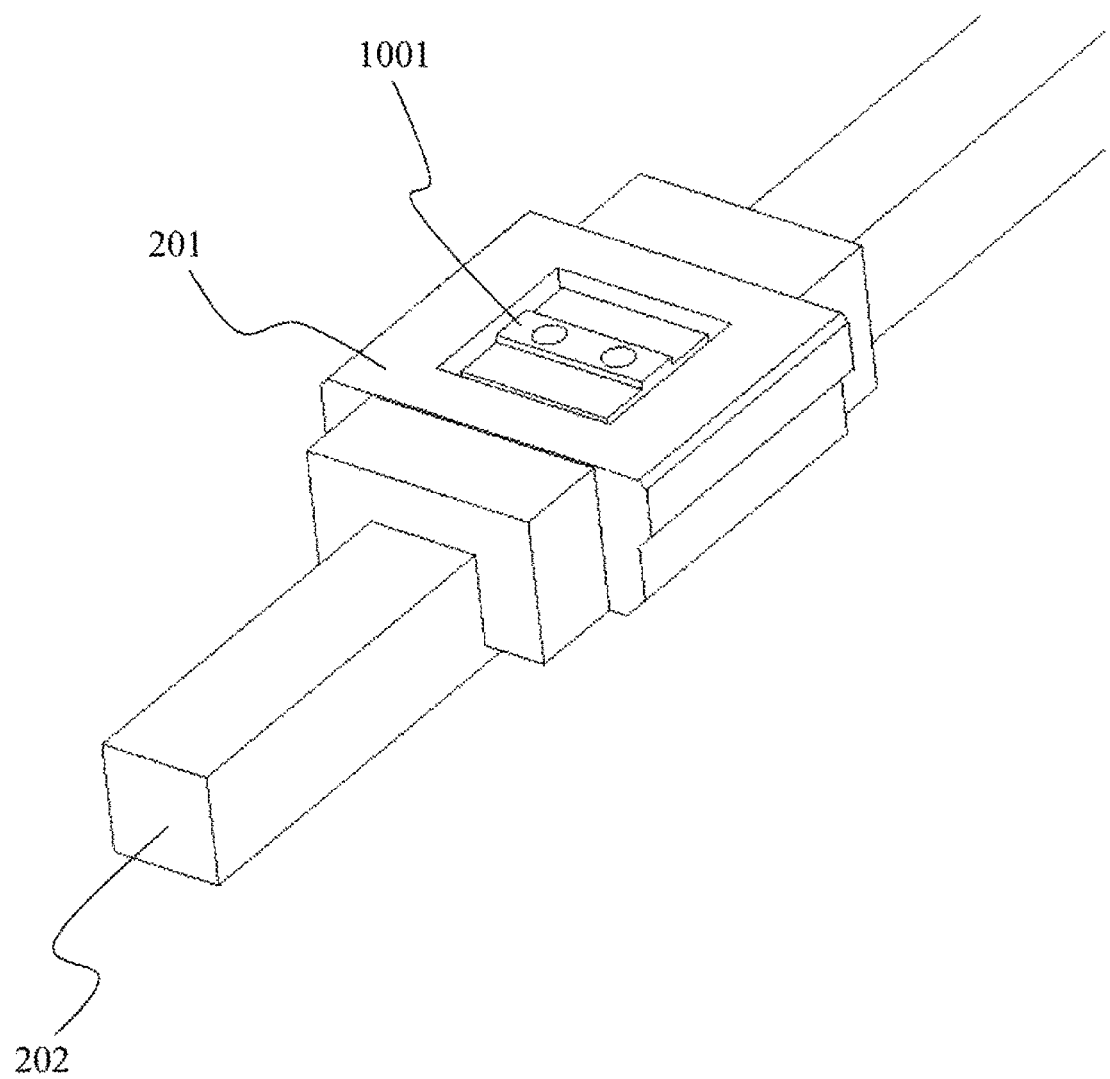

A case of providing an elastic deformation structure as a strain isolation guide structure in a carriage without using an adapter will be described with reference to FIG. 10. Further, a three-dimensional view of the carriage in which the elastic deformation structure is built in will be described with reference to FIG. 11. Further, conversely, a similar effect can be obtained by having similar elastic deformation structures respectively built in fixation portions of carriages in the table. As exemplarily illustrated in FIG. 10, a connection portion 1004 (protruding portion) for connecting a contact portion 1002 with the table 105 and another portion 1003 of the carriage 201 is built in the carriage 201, and the connection portion 1004 is formed into a shape like the protruding portion as described in the first embodiment, whereby an effect similar to the first embodiment can be expected. Note that, even in the present embodiment, two connection portions having different longitudinal directions may be provided in upper and lower portions, similarly to the first embodiment.

Third Embodiment

Figure 12:
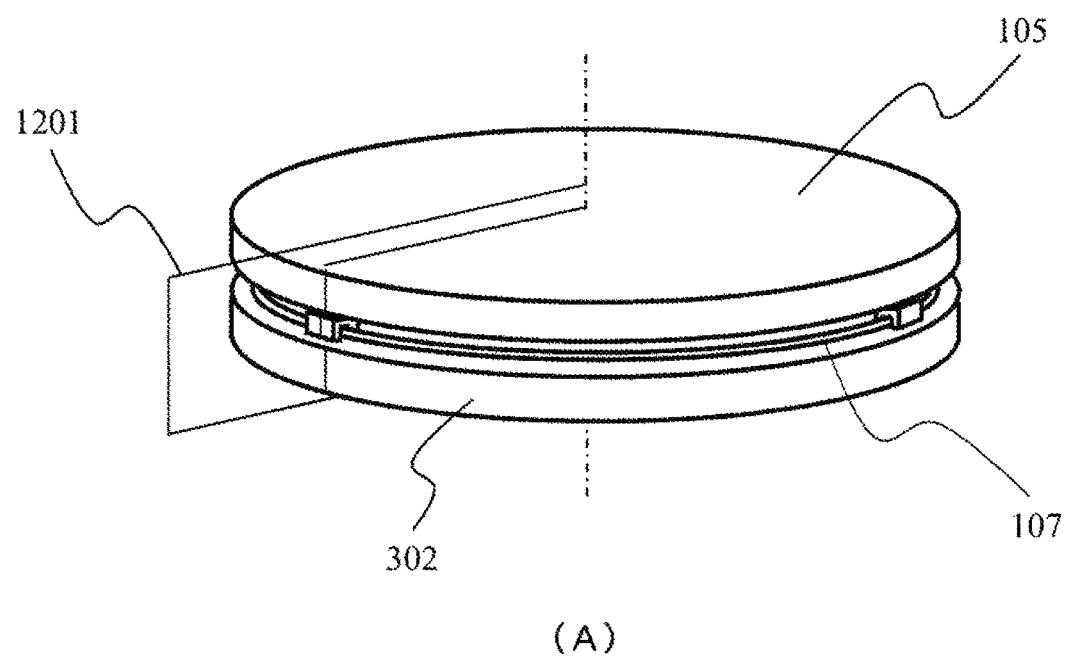
FIG. 12 is views illustrating an application example of the strain isolation guide structure to a rotary table.
Figure 12:
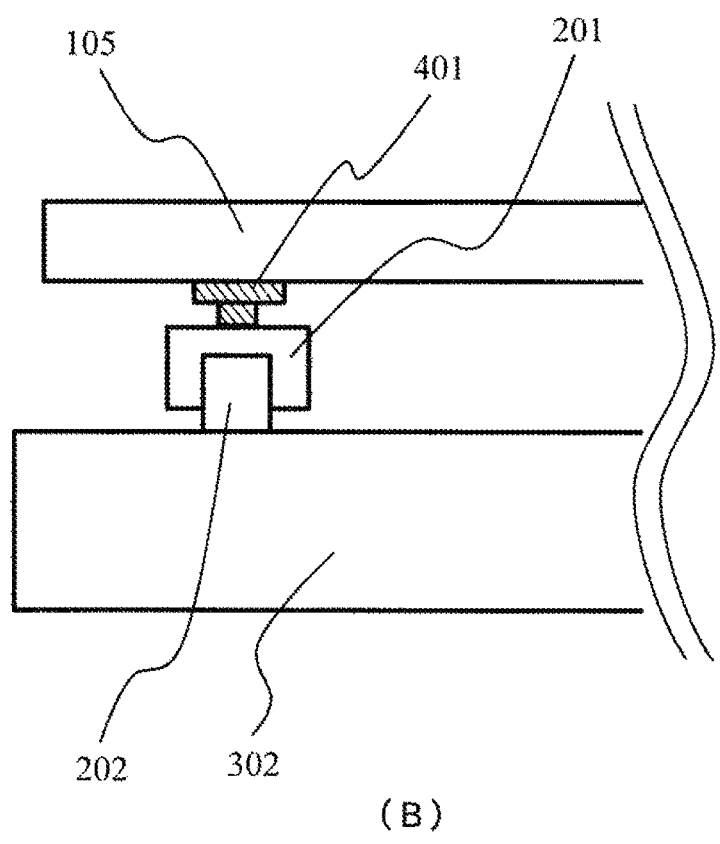

An example in which a strain isolation guide structure is applied to a rotary stage will be described with reference to FIG. 12. FIG. 12(A) illustrates an appearance of the rotary stage. A guide 107 is fixed to a base 302, and a table 105 mounted on the guide 107 can be rotary moved with respect to the base 302. FIG. 12(B) is a cross-sectional view on a plane 1201 of the rotary stage in FIG. 12(A). An adapter 401 is attached to a carriage 201, and the table 105 is fixed to the adapter 401.

With the configuration, deformation of the table 105 at the time of going in and out of the rolling element of the guide can be suppressed, and position shift of a sample in a manner of the table 105 can be suppressed.

REFERENCE SIGNS LIST 101 electronic optical system barrel
104 laser interferometer
105 table
106 wafer
107 guide
108 chuck
109 controller
111 mirror
112 sample chamber
113 vibration removal mount
201 carriage
202 guide rail
203 rolling element
301 laser light
302 base
401 adapter
501 clearance gap 1
502 clearance gap 2
601 range
602 range
1001 adapter structure
1201 plane

The invention claimed is:

1. A sample stage to support a sample, the sample stage comprising:
a table;
a guide rail that extends in a moving direction;
a carriage configured to move along the guide rail in the moving direction together with the table by rotation of a rolling element included inside the carriage; and
an adapter connecting the table and the carriage,
wherein the adapter has a first protruding portion protruding toward the carriage and connected the carriage, and
the first protruding portion has a length in the moving direction which is longer than a length thereof in a direction orthogonal to the moving direction, and wherein the adapter has a second protruding portion protruding toward the table and connected to the table, and the second protruding portion has a length in the direction orthogonal to the moving direction which is longer than a length thereof in the moving direction.

2. The sample stage according to claim 1, wherein a first clearance gap is provided between the adapter and the carriage along the length of the first protruding portion in the moving direction on both sides of the first protruding portion, and wherein a second clearance gap is provided between the adapter and the table along the length of second protruding portion in the direction orthogonal to the moving direction on both sides of the second protruding portion.

3. The sample stage according to claim 1, wherein the length of the first protruding portion in the moving direction which is longer than the length of the second protruding portion in the direction orthogonal to the moving direction.

4. The sample stage according to claim 1, wherein the first protruding portion is aligned with the guide rail and the second protruding portion is orthogonal to the guide rail.

5. The sample stage according to claim 1, wherein the table includes a dug portion which is connected to the second protruding portion.

6. A charged particle beam device comprising:
the sample stage according to claim 1.

7. A sample stage to support a sample, the sample stage comprising:

a table;
a guide rail that extends in a moving direction;
a carriage configured to move along the guide rail in the moving direction together with the table by rotation of a rolling element included inside the carriage; and
an adapter connecting the table and the carriage,
wherein the adapter has a first contact portion in contact with the carriage along the moving direction and a second contact portion in contact with the table along a direction orthogonal to the moving direction,
wherein a first clearance gap between the adapter and the carriage extends along the moving direction on both sides of the first contact portion, and a second clearance gap between the adapter and the table extends along the direction orthogonal to the moving direction on both sides of the second contact portion, and
wherein the adapter is in contact with the table only at the second contact portion.

8. The sample stage according to claim 7, wherein a length of the first contact portion in the moving direction is longer than a length of the first contact portion in the direction orthogonal to the moving direction, and wherein a length of the second contact portion in the direction orthogonal to the moving direction is longer than a length of the second contact portion in the moving direction.

9. A charged particle beam device comprising the sample stage according to claim 7.

\* \* \* \* \*